(12) United States Patent
Kim

(10) Patent No.: US 7,678,661 B2
(45) Date of Patent: Mar. 16, 2010

(54) METHOD OF FORMING AN INSULATING LAYER IN A SEMICONDUCTOR DEVICE

(75) Inventor: Seung Hyun Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 497 days.

(21) Appl. No.: 11/611,711

(22) Filed: Dec. 15, 2006

(65) Prior Publication Data

US 2007/0166984 A1    Jul. 19, 2007

(30) Foreign Application Priority Data

Dec. 29, 2005   (KR) .................. 10-2005-0133396

(51) Int. Cl.
*H01L 21/76* (2006.01)

(52) U.S. Cl. ............... 438/421; 438/619; 257/E21.581

(58) Field of Classification Search ............... 438/421, 438/619; 257/E21.564, E21.573, E21.581
See application file for complete search history.

(56) References Cited

U.S. PATENT DOCUMENTS

| 5,272,115 A | * | 12/1993 | Sato | ............................ 438/14 |
| 5,679,606 A | * | 10/1997 | Wang et al. | .................. 438/763 |
| 5,767,018 A | * | 6/1998 | Bell | ............................ 438/696 |
| 5,792,705 A | * | 8/1998 | Wang et al. | .................. 438/624 |
| 5,814,564 A | * | 9/1998 | Yao et al. | .................... 438/734 |
| 5,872,401 A | * | 2/1999 | Huff et al. | .................... 257/758 |
| 6,228,763 B1 | * | 5/2001 | Lee | ............................ 438/639 |
| 6,255,207 B1 | * | 7/2001 | Jang | ............................ 438/597 |
| 6,339,027 B1 | * | 1/2002 | Chok | .......................... 438/692 |
| 6,593,241 B1 | * | 7/2003 | Abraham et al. | ............ 438/697 |
| 2003/0006467 A1 | * | 1/2003 | Mattei et al. | ................. 257/401 |

* cited by examiner

*Primary Examiner*—Lex Malsawma
(74) *Attorney, Agent, or Firm*—Sherr & Vaughn, PLLC

(57) ABSTRACT

Embodiments relate to semiconductor device and a method of forming an insulating layer with a low dielectric constant in a semiconductor device. The method may include forming a plurality of metal patterns on a semiconductor substrate, depositing a first insulating layer on the entire surface of the semiconductor substrate having the plurality of metal patterns, depositing an etch stop layer on the first insulating layer, depositing a second insulating layer on the etch stop layer, removing the second insulating layer until the etch stop layer formed above each of the plurality of metal patterns is exposed, etching the exposed etch stop layer, and depositing a third insulating layer on the entire surface of the semiconductor substrate.

11 Claims, 4 Drawing Sheets

METHOD OF FORMING AN INSULATING LAYER IN A SEMICONDUCTOR DEVICE

The present application claims priority under 35 U.S.C. 119 and 35 U.S.C. 365 to Korean Patent Application No. 10-2005-0133396 (filed on Dec. 29, 2005), which is hereby incorporated by reference in its entirety.

BACKGROUND

Semiconductor devices may be required to operate at high speeds with large information processing capabilities. Semiconductor devices may also be required to have large storage capacities. To satisfy such requirements, semiconductor manufacturing technology has improved. For example, semiconductor devices may be faster, more highly integrated, and more reliable.

To increase a level of integration, semiconductor devices may be manufactured by forming a metal interconnection in each layer with a multi-layered structure, or by narrowing an interval between metal interconnections in a given layer.

However, as the interval between metal interconnections becomes narrower, it may be important to reduce parasitic resistance or capacitance formed either between metal interconnections adjacent to each other on the same layer or between metal interconnection in adjacent layers (i.e. above and below).

In very highly integrated semiconductor devices, parasitic resistance and capacitance components formed in a multi-layered metal interconnection structure may degrade electrical characteristics of the semiconductor devices. This may be due to a delay induced by resistance capacitance (RC delay), which may increase a power consumption of semiconductor devices.

Therefore, it may be important to develop a technology for multi-layered metal interconnections having a low RC value in very highly integrated semiconductor devices.

To form a high-performance multi-layered metal interconnections having a low RC value, an interconnection layer may be formed by using a metal having low specific resistance. Alternatively, an insulating layer, for example having a low dielectric constant, may be used.

To reduce capacitance, a material having a low dielectric constant may be used.

In the related art, FSG (Fluorine Silicate Glass) layers having a dielectric constant lower than USG (Undoped Silicate Glass) have been used as interlayer dielectric layers. In such devices, however, the dielectric constant of the FSG layers may be reduced by increasing a density of fluorine. It may be difficult to control properties of the FSG layers in such instances. That is, there may be limitations as to how much the capacitance can be reduced by using only an FSG layer.

SUMMARY

Embodiments relate to a method of manufacturing a semiconductor device. Embodiments relate to a method of forming an insulating layer having a low dielectric constant in a semiconductor device.

Embodiments relate to an insulating layer in a semiconductor device, in which an air layer may be formed in an interlayer dielectric layer. This may reduce parasitic resistance and capacitance formed between metal interconnections. Accordingly, highly integrated semiconductor devices may be developed. Embodiments further relate to a method of forming such an insulating layer.

Embodiments relate to an insulating layer in a semiconductor device, in which an air layer having a dielectric constant lower than an FSG layer may be formed in the insulating layer. Capacitance may thereby be reduced. Embodiments also relate to a method of forming such an insulating layer.

In embodiments, a method of forming an insulating layer in a semiconductor device may include forming a plurality of metal patterns on a semiconductor substrate, depositing a first insulating layer on the entire surface of the semiconductor substrate having the plurality of metal patterns, depositing an etch stop layer on the first insulating layer, depositing a second insulating layer on the etch stop layer, removing the second insulating layer until the etch stop layer formed above each of the plurality of metal patterns is exposed, etching the exposed etch stop layer, and depositing a third insulating layer on the entire surface of the semiconductor substrate.

The etch stop layer may include silicon nitride.

The etching process for the exposed etch stop layer may be performed until a portion of the etch stop layer formed beneath the second insulating layer is etched.

Air layers may be formed beneath the second insulating layer etched with the etch stop layer.

The first insulating layer may be deposited through PECVD (Plasma Enhanced Chemical Vapor Deposition) or HDP-CVD (High Density Plasma-Chemical Vapor Deposition).

The second insulating layer may be planarized through a CMP (Chemical Mechanical Polishing) process. The second insulating layer may be wet etched.

DETAILED DESCRIPTION OF EMBODIMENTS

Figure 1A:
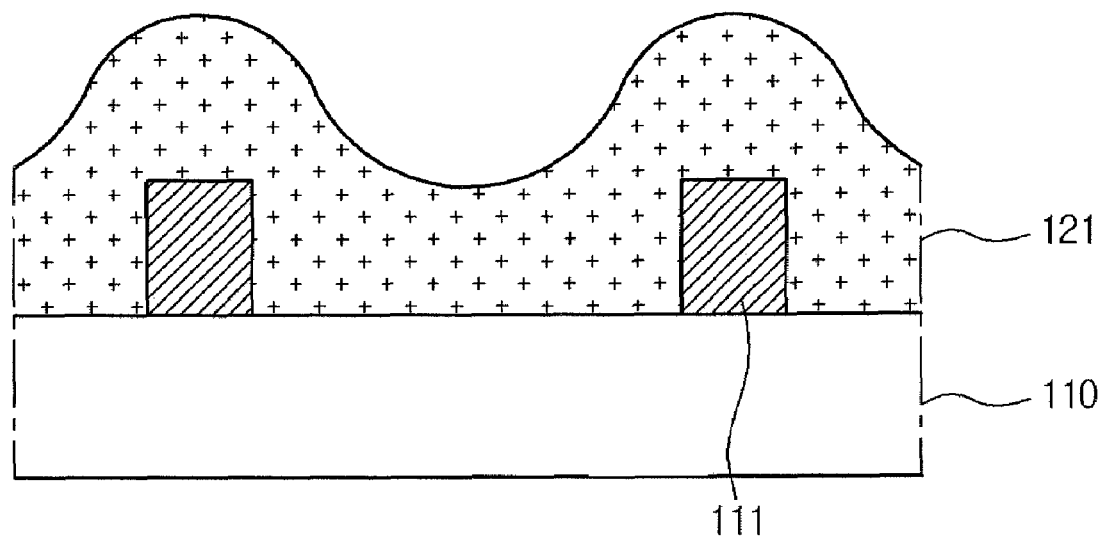
FIGS. 1a to 1e are example sectional diagrams illustrating an insulating layer in a semiconductor device and a process of forming an insulating layer in a semiconductor device according to embodiments.

Referring to FIG. 1a, a plurality of metal patterns 111 may be formed on semiconductor substrate 110.

The plurality of metal patterns 111 may be metal interconnections stacked as multiple layers between insulating layers or a gate pattern formed on a silicon substrate.

First insulating layer 121 may be formed on the plurality of metal patterns 111 and on semiconductor substrate 110, for example through a CVD (Chemical Vapor Deposition) method.

First insulating layer 121 may include includes a low dielectric constant material such as FSG (Fluorinated-Silicate-Glass), and may be deposited through a PECVD (Plasma Enhanced Chemical Vapor Deposition) method.

The thickness of first insulating layer 121 may be approximately 4000 Å to 5000 Å.

According to embodiments, first insulating layer 121 may have a curved shape with concaves and convexes that may be caused by a step difference between metal pattern 111 and semiconductor substrate 110.

Figure 1B:
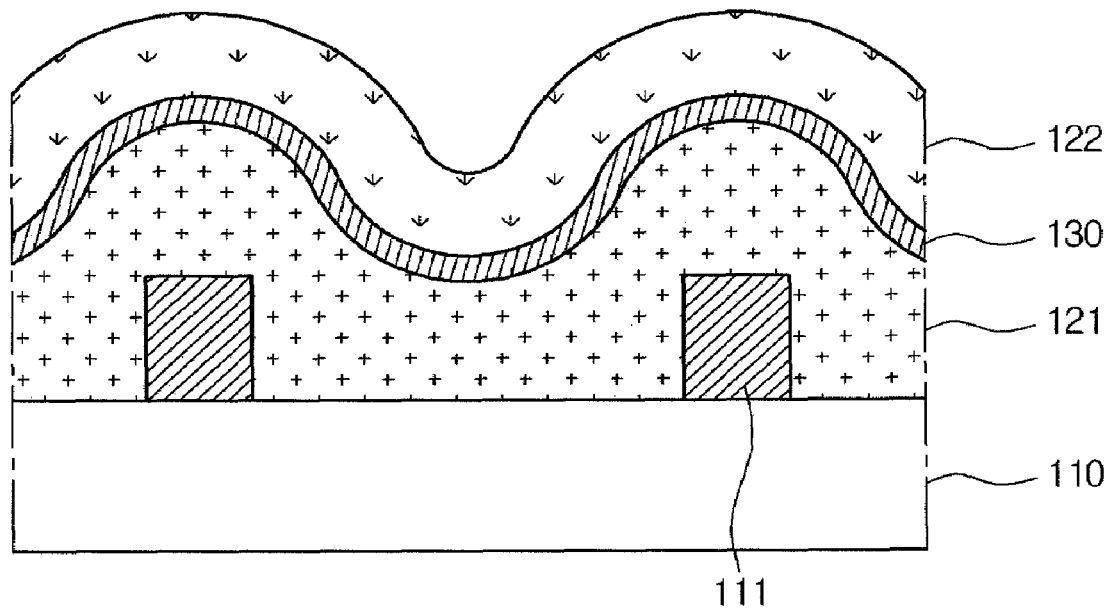

Referring to FIG. 1b, a layer of silicon nitride (SiNx) may be formed on first insulating layer 121 as etch stop layer 130. A thickness of the silicon nitride may be 300 Å to 700 Å.

Etch stop layer 130 may have a curved shape with concaves and convexes along with the curved shape of first insulating layer 121.

According to embodiments, a low dielectric constant material, such as FSG, may be deposited on the layer of silicon nitride (i.e. on the first etch stop layer 130) through a PECVD method, and may thereby form second insulating layer 122.

Second insulating layer 122 may have a curved shape with concaves and convexes along with a curved shape of first insulating layer 121 and etch stop layer 130.

According to embodiments, second insulating layer 122 may be etched while being planarized, for example through a chemical mechanical polishing (CMP) process.

Figure 1C:
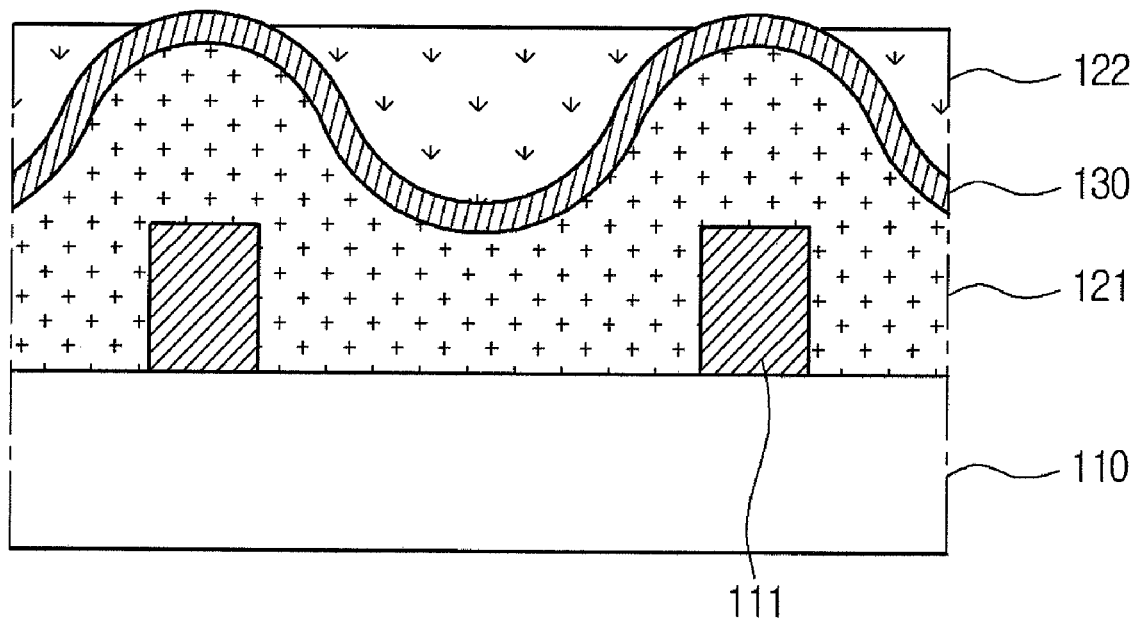

Referring to FIG. 1c, a CMP process of second insulating layer 122 may be stopped when a portion of etch stop layer 130 is exposed.

Because etch stop layer 130 may have a curved shape with concaves and convexes along with the curved shape a portion of etch stop layer 130 at a convex portion may become exposed through the CMP process.

Thus, according to embodiments, second insulating layer 122 may be overpolished. Etch stop layer 130 may therefore protrude and be exposed as shown in FIG. 1c.

Figure 1D:
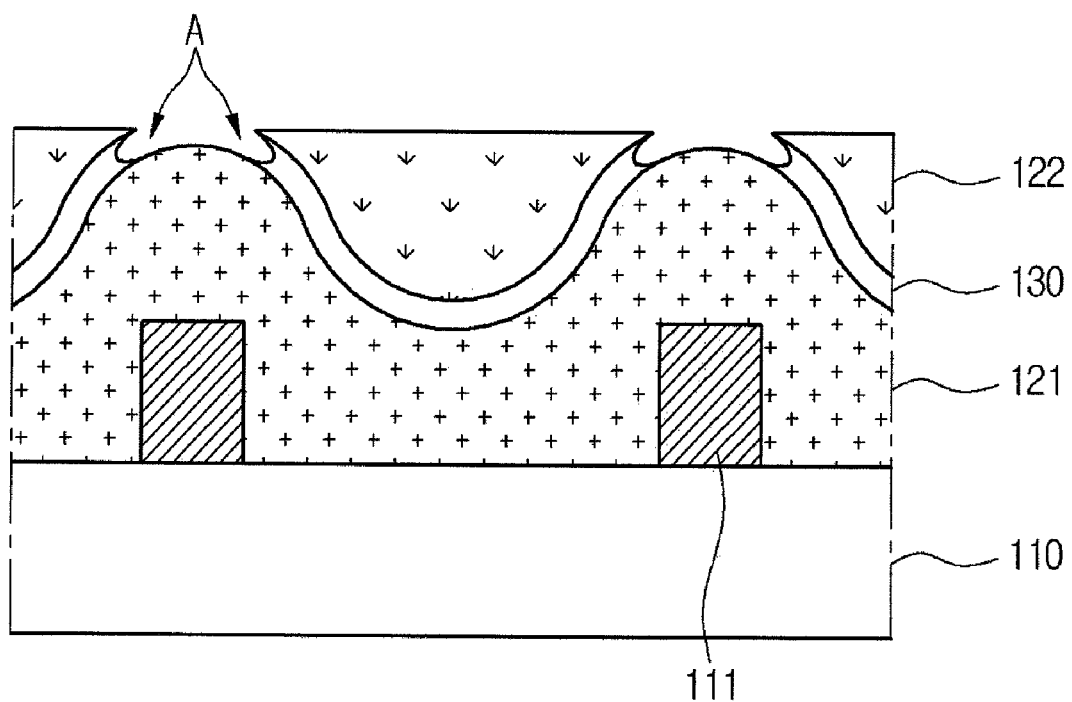

Referring to FIG. 1d, a portion of etch stop layer 130 that may have been exposed by the CMP process to second insulating layer 122 may be removed, for example through a wet etching process. According to embodiments, $H_3PO_4$ or the like may be used as an etchant of the silicon nitride that is etch stop layer 130. As illustrated in FIG. 1d, convex regions of first insulating layer 121 may thus be exposed, for example through such an etching process.

The wet etching process may be an isotropic etching process, in which an undercut occurs in overetching. That is, the undercut cave-shaped spaces may be formed along a convex of etch stop layer 130. The cave-shaped space may be referred to as undercut area A.

It will be understood by those skilled in the art that an etchant, etching time, and etch rate may be adjusted in a wet etching process for etch stop layer 130. Accordingly, undercut area A may be formed having a variety of sizes.

In embodiments, a portion of etch stop layer 130 may remain beneath second insulating layer 122, as illustrated in FIG. 1d.

Figure 1E:
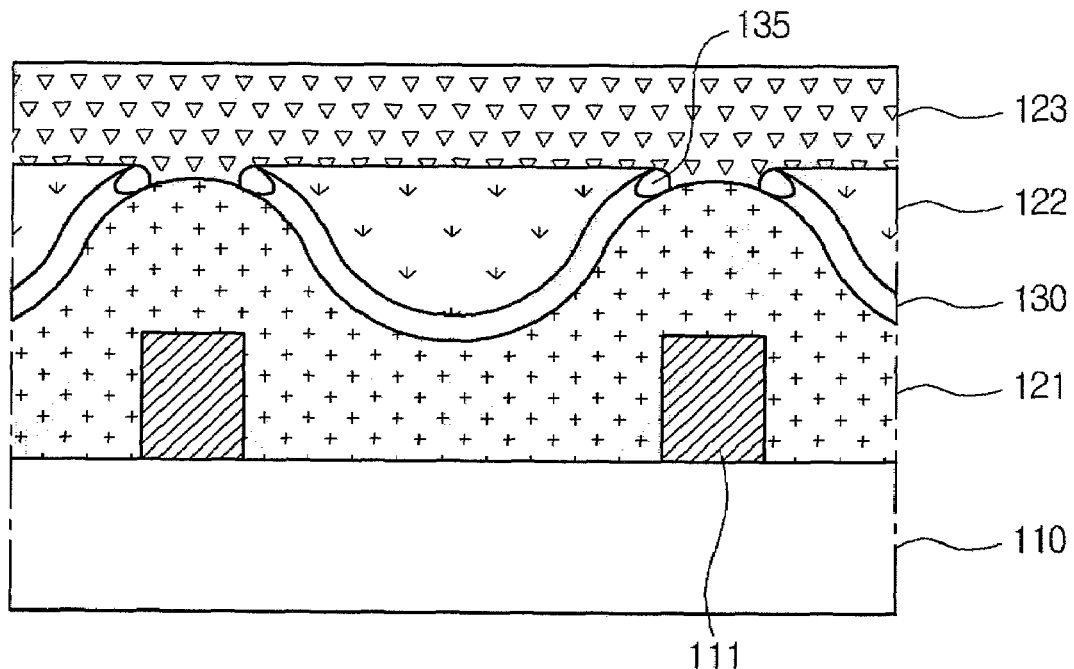

Referring to FIG. 1e, third insulating layer 123 may be formed on top surfaces of first and second insulating layers 121 and 122.

Third insulating layer 123 may be formed by depositing a low dielectric constant material, for example such as FSG, through a PECVD method. According to embodiments, a thickness of third insulating layer 123 may be 4000 Å to 5000 Å. Third insulating layer 123 may be formed to be substantially flat with little curved shape.

According to embodiments, since undercut area A may have a cave shape in an area where undercut area A is not filled with third insulating layer 123, air layers 135 may be formed when depositing third insulating layer 123, for example as shown in FIG. 1e.

Air layers 135 may be formed in a pair at both sides of the convex of first insulating layer 121 deposited on a top surface of metal pattern 111.

The plurality of air layers 135 may thus be formed in an interlayer insulating layer having first, second, and third insulating layers 121, 122, and 123. Since the dielectric constant of air may be low, for example as small as 1, parasitic capacitance occurring in a multi-layered contact structure may be reduced in various semiconductor devices.

According to embodiments, in semiconductor devices, a dielectric constant of an interlayer dielectric layer may be reduced, and may thereby decrease an RC value. Electrical characteristics of the semiconductor devices may thereby be enhanced and power efficiency of the semiconductor devices may be improved.

According to embodiments, in highly integrated semiconductor devices, an existing low dielectric material, for example one that may be easy to process, may be used and an air layer may be formed in the low dielectric material. This may lower a dielectric constant, and may increase usefulness, while decreasing design and manufacturing costs.

In embodiments, an air layer may be artificially formed in an insulating layer. This may prevent damage in subsequent manufacturing processes. A production yield may thereby be increased.

Figure 2A:
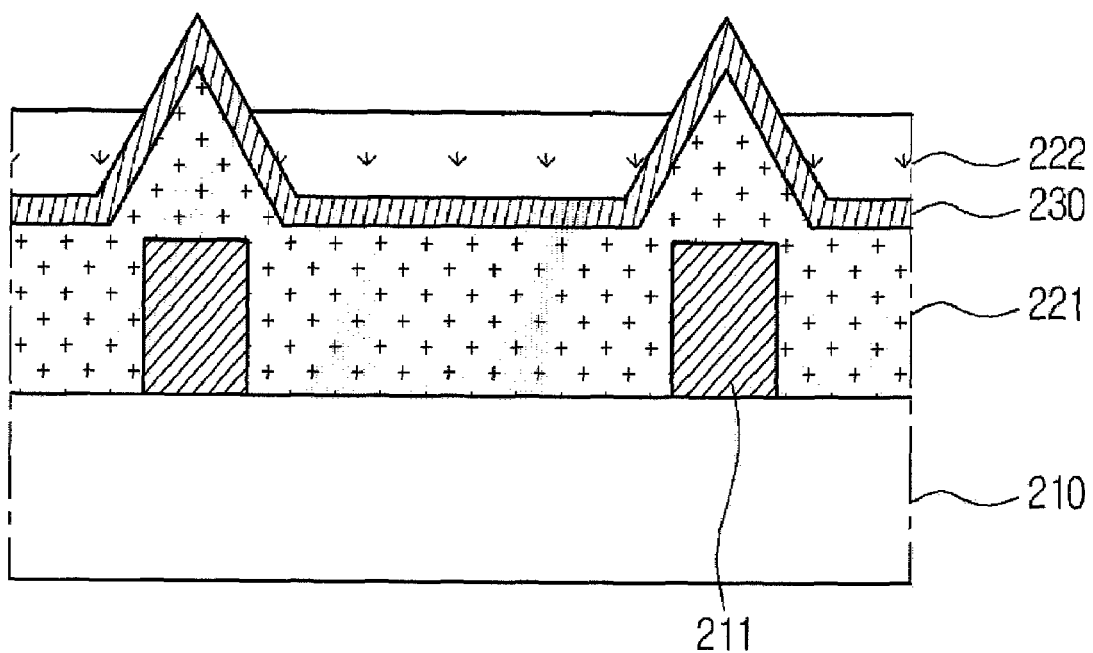
FIGS. 2a to 2c are example sectional diagrams illustrating an insulating layer in a semiconductor device and a process of forming an insulating layer in a semiconductor device according to embodiments.
Figure 2B:
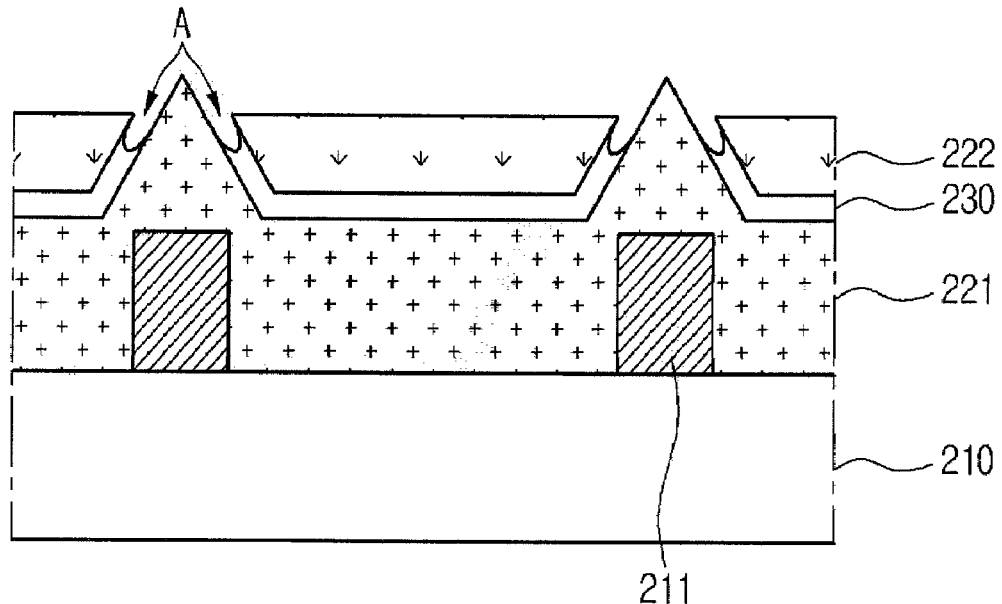
Figure 2C:
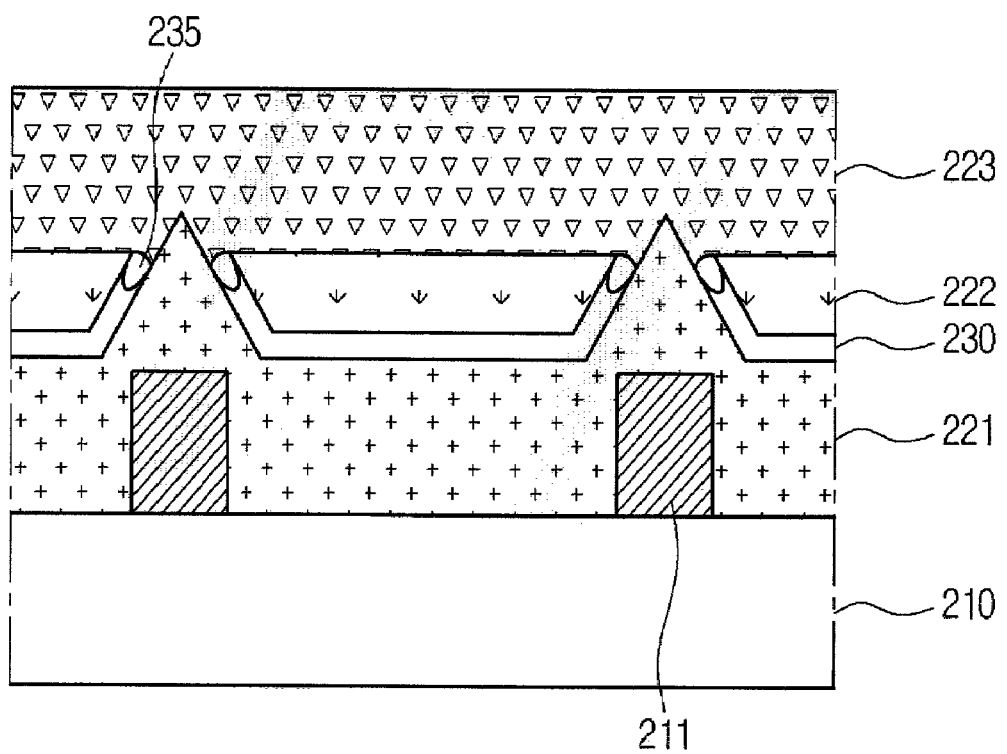

FIGS. 2a to 2c are example sectional diagrams illustrating a process of forming an insulating layer in a semiconductor device according to embodiments.

Referring to FIG. 2a, metal patterns 211 may be formed on semiconductor substrate 210.

Metal patterns 211 may be metal interconnections stacked as multiple layers between insulating layers or a gate pattern formed on a silicon substrate.

First insulating layer 221 may be formed on metal patterns 211 and semiconductor substrate 210, for example through high density plasma-chemical vapor deposition (HDP-CVD) that may have a good gap-fill ability for filling a space between metal patterns.

First insulating layer 221 may include a low dielectric material such as FSG (Fluorinated-Silicate-Glass). A thickness of first insulating layer 221 may be 4000 Å to 5000 Å.

The HDP-CVD is a process in which high-density plasma ions may be formed, for example by applying an electromagnetic field, and may have a relatively high ionization efficiency, for example as compared to PECVD. An insulating layer may be deposited on a wafer by resolving a source gas.

In HDP-CVD, bias power for etching an insulating layer deposited on a wafer may be applied together with source power to generate plasma while depositing the insulating layer. Deposition and sputtering etching of the insulating layer may thus be simultaneously performed.

According to embodiments, in HDP-CVD, a deposition of an insulating layer may be performed by using $SiH_4$ and $O_2$ gases or $SiF_4$ gas. The sputtering etching of an insulating layer may be performed by using Ar gas.

According to embodiments, since first insulating layer 221 formed through the HDP-CVD may be formed by simultaneously performing deposition and etching processes, first insulating layer 221 may have a triangular shape above the lower metal pattern 211.

Silicon nitride (SiNx) may be formed on first insulating layer 221 as etch stop layer 230.

According to embodiments, a thickness of the silicon nitride may be 300 Å to 700 Å.

Etch stop film 230 may be formed to have concaves and convexes along with the triangular shape of first insulating layer 221.

A low dielectric constant material, for example such as FSG, may be deposited on the silicon nitride through a PECVD method. Second insulating layer 222 may thereby be formed.

Second insulating layer 222 may be formed along with the triangular shape of first insulating layer 221 and etch stop layer 230.

Second insulating layer 222 may be etched while being planarized through a CMP process.

The CMP process of second insulating layer 222 may stop when a portion of etch stop layer 230 is exposed.

Second insulating layer 222 may be etched, for example by performing a wet etching process.

Thus, a portion exposed through the CMP or wet etching process may be a convex (e.g. apex) of the triangular-shaped etch stop layer 230.

Since second insulating layer 222 may be etched more due to a high selection ratio of etch stop layer 230 to second insulating layer 222, etch stop layer 230 may protrude.

According to embodiments, second insulating layer 222 may remain after the etching process is formed in a concave region between the triangular shapes (e.g. at an apex area of the triangle).

Referring to FIG. 2b, etch stop layer 230 exposed by second insulating layer 222 may be removed, for example through a wet etching process, and may expose first insulating layer 221.

According to embodiments, $H_3PO_4$ or the like may be used as an etchant of the silicon nitride that is etch stop layer 230.

The wet etching process may be an isotropic etching process, in which undercut area A may occur due to overetching.

That is, etch stop layer 230 formed beneath second insulating layer 222 may be undercut etched. This may form a cave-shaped space. However, since etch stop layer 230 may be formed along with a rapidly inclined slope of first insulating layer 221, etch stop layer 230 may be overetched by the etchant at the rapidly inclined portion (e.g. on either side of an apex of the first insulating layer 221). This may form undercut area A.

Referring to FIG. 2c, third insulating layer 223 may be formed on top surfaces of first and second insulating layers 221 and 222.

Third insulating layer 223 may be formed by depositing a low dielectric constant material, such as FSG, through a PECVD method. According to embodiments, a thickness of third insulating layer 223 may be 4000 Å to 5000 Å.

When depositing third insulating layer 223, the cave-shaped undercut areas A may not be filled with third insulating layer 223. Thus, air layers 235 may be formed in undercut areas A, for example as shown in 2c.

Air layers 235 may be formed in a pair at both sides above lower metal pattern 221.

According to embodiments, since the plurality of air layers 235 may be formed in an interlayer dielectric layer having the first, second, and third insulating layers 221, 222, and 223, a dielectric constant of the interlayer dielectric layer may be lowered. Accordingly, parasitic capacitance of the interlayer dielectric layer may be reduced.

According to embodiments, a dielectric constant of an interlayer dielectric layer may be reduced. This may decrease an RC value. Electrical characteristics of a semiconductor device may therefore be enhanced and power efficiency of the semiconductor device may be improved.

According to embodiments, in highly integrated semiconductor devices, an existing low dielectric material that can be easily processed may be used and an air layer may be formed in the low dielectric material. This may lower a dielectric constant, and increased its usefulness, while reducing design and manufacturing costs.

According to embodiments, an air layer may be artificially formed in an insulating layer. This may prevent damage due to subsequent processes and may increase a production yield.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   depositing a first insulating layer on a surface of a semiconductor substrate;
   depositing an etch stop layer on the first insulating layer;
   depositing a second insulating layer on the etch stop layer;
   removing a portion of the second insulating layer until a portion of the etch stop layer is exposed;
   removing at least the exposed etch stop layer; and
   depositing a third insulating layer over the first and second insulating layers to form an air layer between at least the first and third insulating layers,
   wherein the first insulating layer and the etch stop layer are substantially curved in shape, and wherein the etch stop layer is removed substantially at an apex of the curve.

2. The method of claim 1, further comprising forming a plurality of metal patterns on the semiconductor substrate.

3. The method of claim 2, wherein the portion of the second insulating layer removed is above each of the plurality of metal patterns such that the portion of the etch stop layer exposed is above each of the plurality of metal patterns.

4. The method of claim 1, wherein the air layer is formed where a portion of the etch stop layer was removed.

5. The method of claim 1, wherein the etch stop layer comprises silicon nitride.

6. The method of claim 1, wherein the etching process for the exposed etch stop layer is performed until a portion of the etch stop layer formed beneath the second insulating layer is etched.

7. The method of claim 6, wherein two air layers are formed beneath the second and third insulating layers at a portion where the etch stop layer has been etched.

8. The method of claim 1, wherein the first insulating layer is deposited through PECVD (Plasma Enhanced Chemical Vapor Deposition) or HDP-CVD (High Density Plasma-Chemical Vapor Deposition).

9. The method of claim 1, wherein the second insulating layer is planarized through a CMP (Chemical Mechanical Polishing) process.

10. The method of claim 1, wherein the second insulating layer is wet etched.

11. A method comprising:
    depositing a first insulating layer on a surface of a semiconductor substrate;
    depositing an etch stop layer on the first insulating layer;
    depositing a second insulating layer on the etch stop layer;
    removing a portion of the second insulating layer until a portion of the etch stop layer is exposed;
    removing at least the exposed etch stop layer; and
    depositing a third insulating layer over the first and second insulating layers to form an air layer between at least the first and third insulating layers,
    wherein the first insulating layer and the etch stop layer are substantially triangular in shape, and wherein the etch stop layer is removed substantially at an apex of the curve.

* * * * *